(12) United States Patent
Murata

(10) Patent No.: US 7,971,112 B2
(45) Date of Patent: Jun. 28, 2011

(54) MEMORY DIAGNOSIS METHOD

(75) Inventor: Takehiko Murata, Kahoku (JP)

(73) Assignee: Fujitsu Limited, Kawasaki (JP)

( * ) Notice: Subject to any disclaimer, the term of this patent is extended or adjusted under 35 U.S.C. 154(b) by 231 days.

(21) Appl. No.: 12/358,366

(22) Filed: Jan. 23, 2009

(65) Prior Publication Data

US 2009/0199056 A1    Aug. 6, 2009

(30) Foreign Application Priority Data

Feb. 5, 2008   (JP) ................................. 2008-025469

(51) Int. Cl.
*G11C 29/00* (2006.01)
(52) U.S. Cl. ........................................ 714/719; 714/723
(58) Field of Classification Search .................. 714/710, 714/718, 719
See application file for complete search history.

(56) References Cited

U.S. PATENT DOCUMENTS

| | | | | |
|---|---|---|---|---|
| 5,610,929 A * | 3/1997 | Yamamoto | ..................... | 714/785 |
| 7,171,594 B2 * | 1/2007 | Wyatt et al. | ..................... | 714/704 |
| 7,308,603 B2 * | 12/2007 | Carver et al. | ..................... | 714/8 |
| 7,386,771 B2 * | 6/2008 | Shuma | ..................... | 714/718 |
| 7,447,955 B2 * | 11/2008 | Niijima et al. | ..................... | 714/718 |
| 7,555,692 B1 * | 6/2009 | Iacobovici | ..................... | 714/746 |
| 7,587,656 B2 * | 9/2009 | Larsen et al. | ..................... | 714/769 |
| 7,761,770 B2 * | 7/2010 | Larsen et al. | ..................... | 714/758 |

FOREIGN PATENT DOCUMENTS

JP    2-244339    9/1990

* cited by examiner

*Primary Examiner* — James C Kerveros
(74) *Attorney, Agent, or Firm* — Staas & Halsey LLP

(57) ABSTRACT

A method of an apparatus for diagnosing a memory including a storing module for storing diagnosis information relating to memory errors in a memory to be diagnosed, the apparatus capable of detecting memory errors, the method includes: testing the memory and detecting a memory error for each of a plurality of areas of the memory; dividing at least one of the areas into a plurality of sub-areas upon detection of a memory error in the at least one of the areas; testing the sub-areas and detecting a memory error for each of the plurality of the sub-areas; counting the number of sub-areas where a memory error is detected; and storing information of the number of the sub-areas where a memory error is detected together with information of the at least one of the areas containing the sub-areas into the storing module.

5 Claims, 5 Drawing Sheets

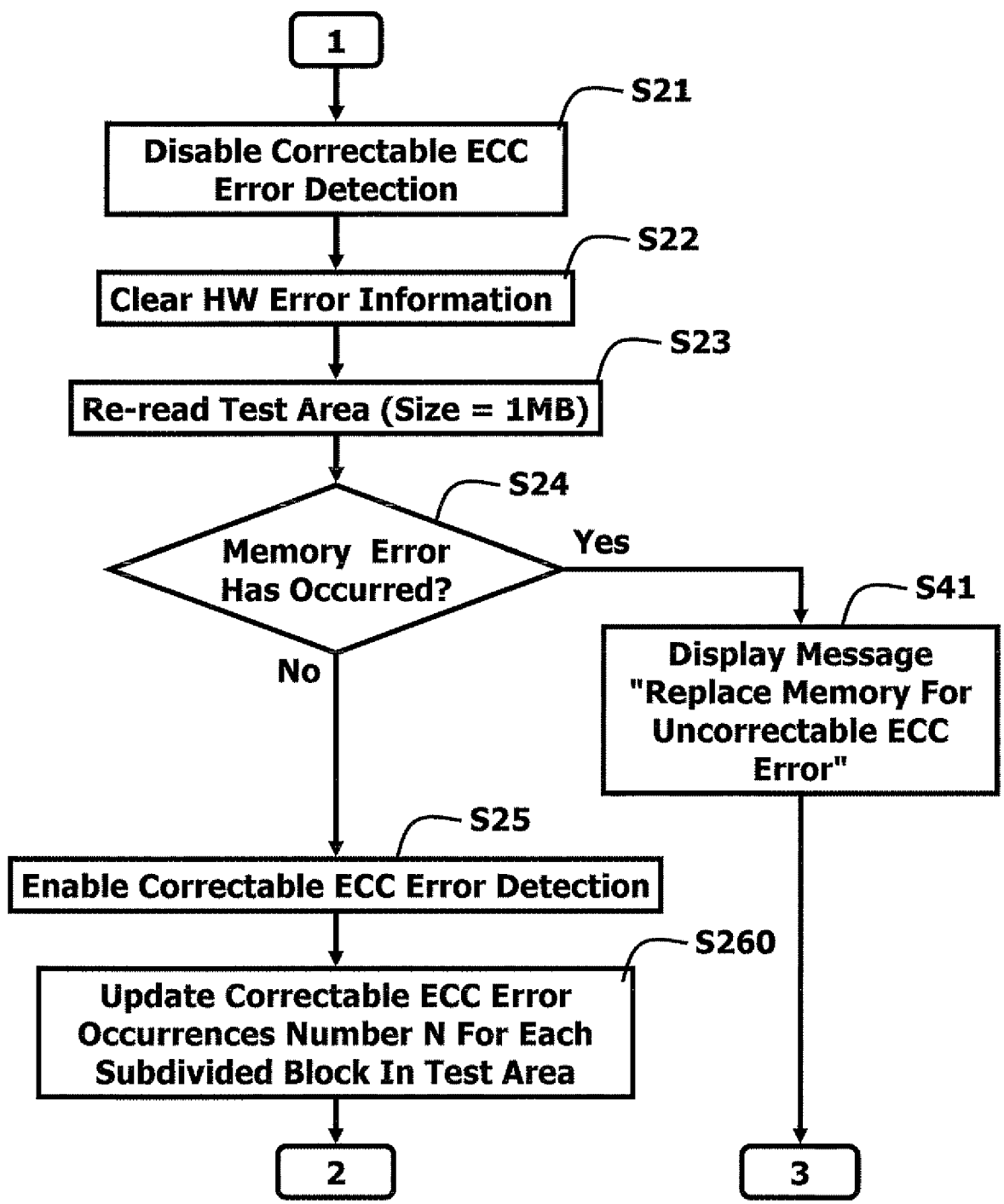

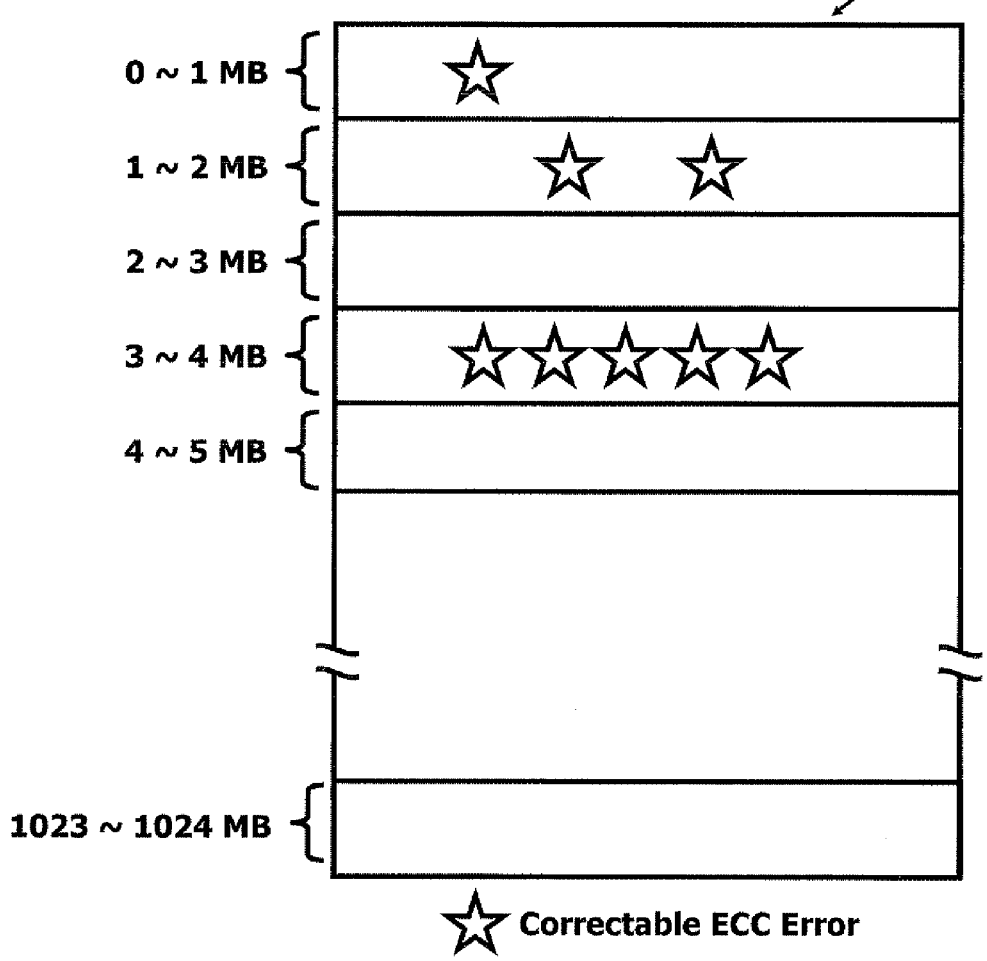

MEMORY DIAGNOSIS METHOD

CROSS-REFERENCE TO RELATED APPLICATION

This application is based upon and claims the benefit of priority of the prior Japanese Patent Application No. 2008-025469, filed on Feb. 5, 2008, the entire contents of which are incorporated herein by reference.

FIELD

The embodiment discussed herein is related to a memory diagnosis method.

BACKGROUND

Generally, servers have memories with ECC (Error Check and Correct) functions in order to gain a reliability of data. ECC memories have capabilities of detecting and correcting any erroneous 1-bit value of 64 bits (8 bytes) by associating 8-bit (1-byte) error correction data per 64-bit memory. This error is called a correctable ECC error. When 2 bits or more have erroneous values at the same time, the ECC memories can detect the occurrences of the error but may not correct the error. This error is called an uncorrectable ECC error.

When uncorrectable ECC error has occurred, it is necessary to replace the memory. On the other hand, when correctable ECC error has occurred, the data can be corrected, but when correctable ECC error has occurred multiple times, the quality of the memory is questionable. Thus, the memory needs to be replaced when correctable ECC error has occurred a certain number of times or more. That is, when the number of occurrences of correctable ECC error is greater than or equal to a certain number, it is desired that the error is handled as hardware error. Therefore, the number of occurrences of error provides important information for detecting hardware error, particularly, a memory defect.

One example of related art is disclosed in Japanese Laid-open Patent Publication No. 2-244339 (refer to claim 1 and FIG. 1 therein). In the related art, during occurrence of memory error, hardware operates to cause a CPU to execute a trap program for error processing by causing software to generate a trap each time memory error occurs, i.e., to interrupt a CPU each time memory error occurs. Thus, there is a problem in that a correct number of occurrences of memory error may not be known when error occurs sequentially.

SUMMARY

According to a method of an apparatus for diagnosing a memory including a storing module for storing diagnosis information relating to memory errors in a memory to be diagnosed, the apparatus capable of detecting memory errors, the method includes: testing the memory and detecting a memory error for each of a plurality of areas of the memory; dividing at least one of the areas into a plurality of sub-areas upon detection of a memory error in the at least one of the areas; testing the sub-areas and detecting a memory error for each of the plurality of the sub-areas; counting the number of sub-areas where a memory error is detected; and storing information of the number of the sub-areas where a memory error is detected together with information of the at least one of the areas containing the sub-areas into the storing module.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 2C is a flowchart illustrating details of step S260 in the flowchart illustrated in FIG. 2B;

FIGS. 3A and 3B illustrate data stored in a register in a memory controller, the data in FIG. 3A indicating occurrences of ECC error and the data in FIG. 3B indicating descriptions of the ECC error; and FIG. 4 illustrates a specific example of memory areas to be tested by the processor illustrated in FIG. 1.

DESCRIPTION OF EMBODIMENT

Figure 1:
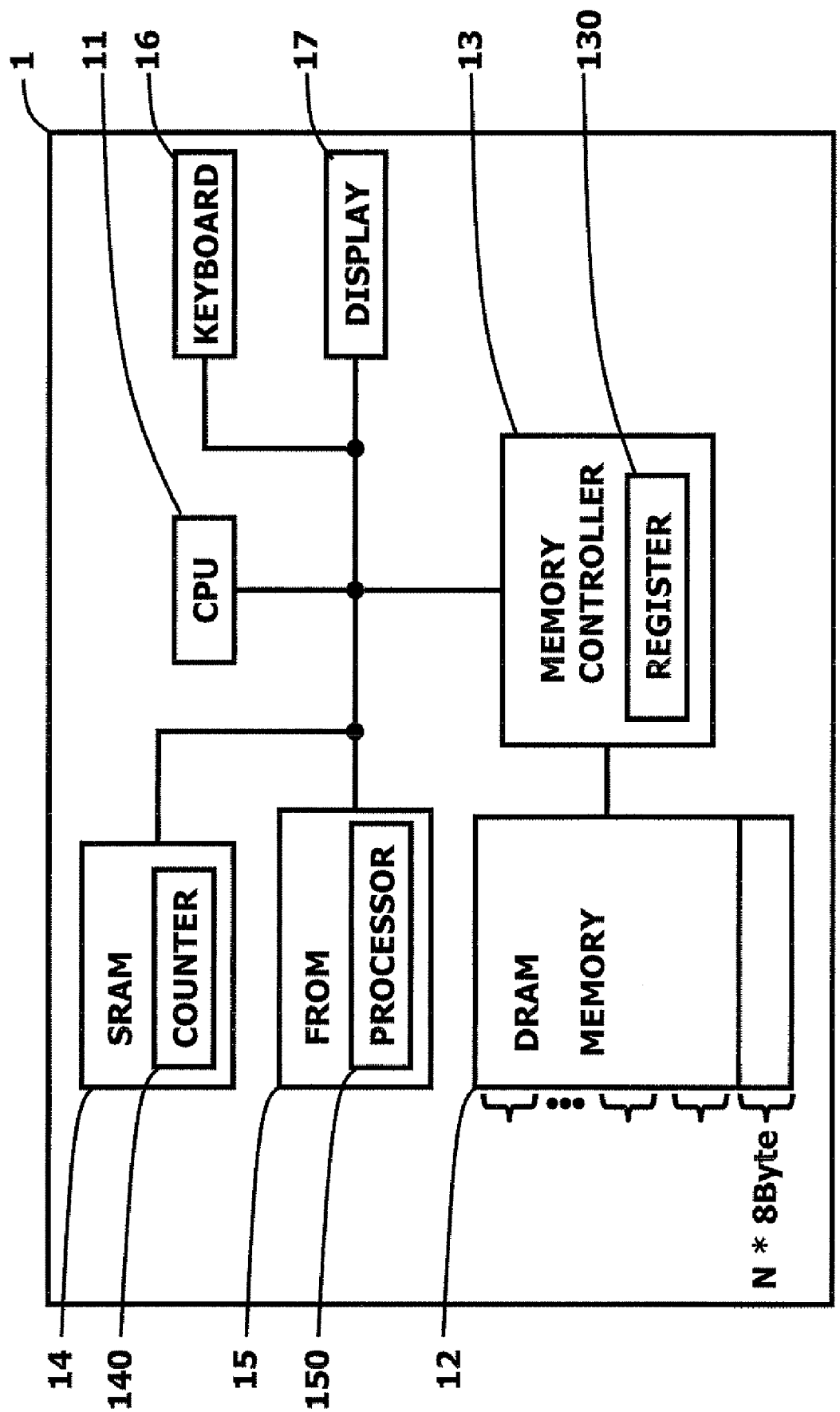
FIG. 1 is a block diagram of a defective-memory detecting apparatus according to one embodiment of the present invention.

As described previously, introducing the related art, during occurrence of memory error hardware operates to cause a CPU to execute a trap program for error processing by causing software to generate a trap each time memory error occurs, i.e., to interrupt a CPU each time memory error occurs. Thus, there is a problem in that a correct number of occurrences of memory error may not be known when error occurs sequentially.

One scheme for overcoming the above-described problem is to employ hardware having a function for storing error information even if error has occurred sequentially. This function is a called memory-error statistics function. Hardware with the statistics function can generally count a limited number of times (T+1) of error. However, the type of error (i.e., correctable ECC error or uncorrectable ECC error) can be known up to only a predetermined number of times T. Thus, when error has occurred the limited number of times (T+1) or more sequentially, the occurrence of the error can be detected but the type of error (i.e., correctable ECC error or uncorrectable ECC error) may not be identified. Thus, there is a problem in that a correct number of occurrences of memory error may not be known when error has occurred sequentially.

A failure analyzing circuit in a primary storage device disclosed in Japanese Laid-open Patent Publication No. 2-244339 has a correctable-error detecting circuit group 1 and an uncorrectable-error detecting circuit group 2. When error occurs a limited number of times (T+1) or more sequentially, the failure analyzing circuit can detect the occurrences of the error but may not detect the type of error. Thus, when error occurs sequentially, the failure analyzing circuit may not know a correct number of occurrences of the memory error and thus has a problem of being unable to perform correct defective-memory detection.

Preferred embodiment of the present invention will be explained with reference to accompanying drawings. The apparatus diagnoses the memory. The apparatus may detect memory errors. The apparatus includes a storing module and a processor. The storing module stores diagnosis information relating to memory errors in the memory to be diagnosed. The processor executes a process including: testing the memory and detecting a memory error for each of a plurality of areas of the memory, dividing at least one of the areas into a plurality of sub-areas upon detection of a memory error in the at least one of the areas, testing the sub-areas and detecting a memory error for each of the plurality of the sub-areas, counting the number of sub-areas where a memory error is detected, and storing information of the number of the sub-areas where a memory error is detected together with information of the at least one of the areas containing the sub-areas into the storing module.

The present invention has been conceived in order to overcome the above-described problems, and an object of the present invention is to provide defective-memory detecting electronic equipment, a defective-memory detecting method, and a program therefor which correctly count the number of occurrences of memory error by reflecting the type of memory error obtained using hardware having a memory-error statistics function into the count value of the number of occurrences of the memory error and check the quality of a memory on the basis of the counted number of occurrences.

FIG. 1 is a block diagram of a defective-memory detecting apparatus according to one embodiment of the present invention. A defective-memory detecting apparatus 1 illustrated in FIG. 1 serves as electronic equipment including a CPU 11, a dynamic random access memory (DRAM) 12, a memory controller 13 having an ECC (Error Check and Correct) function, a static random access memory (SRAM) 14, a flash read only memory (FROM) 15, a keyboard 16, a display 17, and so on. A flash memory is also known as a flash ROM or a flash EEPROM and is a nonvolatile memory that allows for data writing/reading even when the power is turned off. The memory controller 13 for example, may achieve he storing module. A combination the CPU 11, SRAM 14, FROM 15, for example, may achieve the processor.

The memory controller 13 has a register 130 for storing data regarding ECC errors recorded when error is detected from a memory area in the DRAM (hereinafter simply referred to as a "memory") 12 to be tested. The memory controller 13 writes 1 MB data (a test pattern) to the memory 12, and when a processor 150 described below reads the written test pattern, the memory controller 13 checks whether or not the test pattern has any error.

The SRAM 14 has a counter 140. The counter 140 may be provided in free space in the memory 12, i.e., in an area in the memory 12 excluding a memory area to be tested.

The FROM 15 has the processor 150. The processor 150 may be provided in free space in the memory 12, i.e., in an area in the memory 12 excluding a memory area to be tested. In such a case, the processing speed can be increased. The processor 15 may be provided in the SRAM 14 having a capacity that is capable of storing a program for executing the operation of the processor 150. In such a case, the processing speed can be further increased.

The counter 140 counts the number of occurrences N of memory error in a first memory area of divided memory areas in the memory 12 to a last memory area thereof, the memory error being detected from the data (the test pattern) written from the CPU 11 to the memory areas via the memory controller 13. The term "memory error" herein refers to both a correctable type of error and an uncorrectable type of error.

Figure 2A:
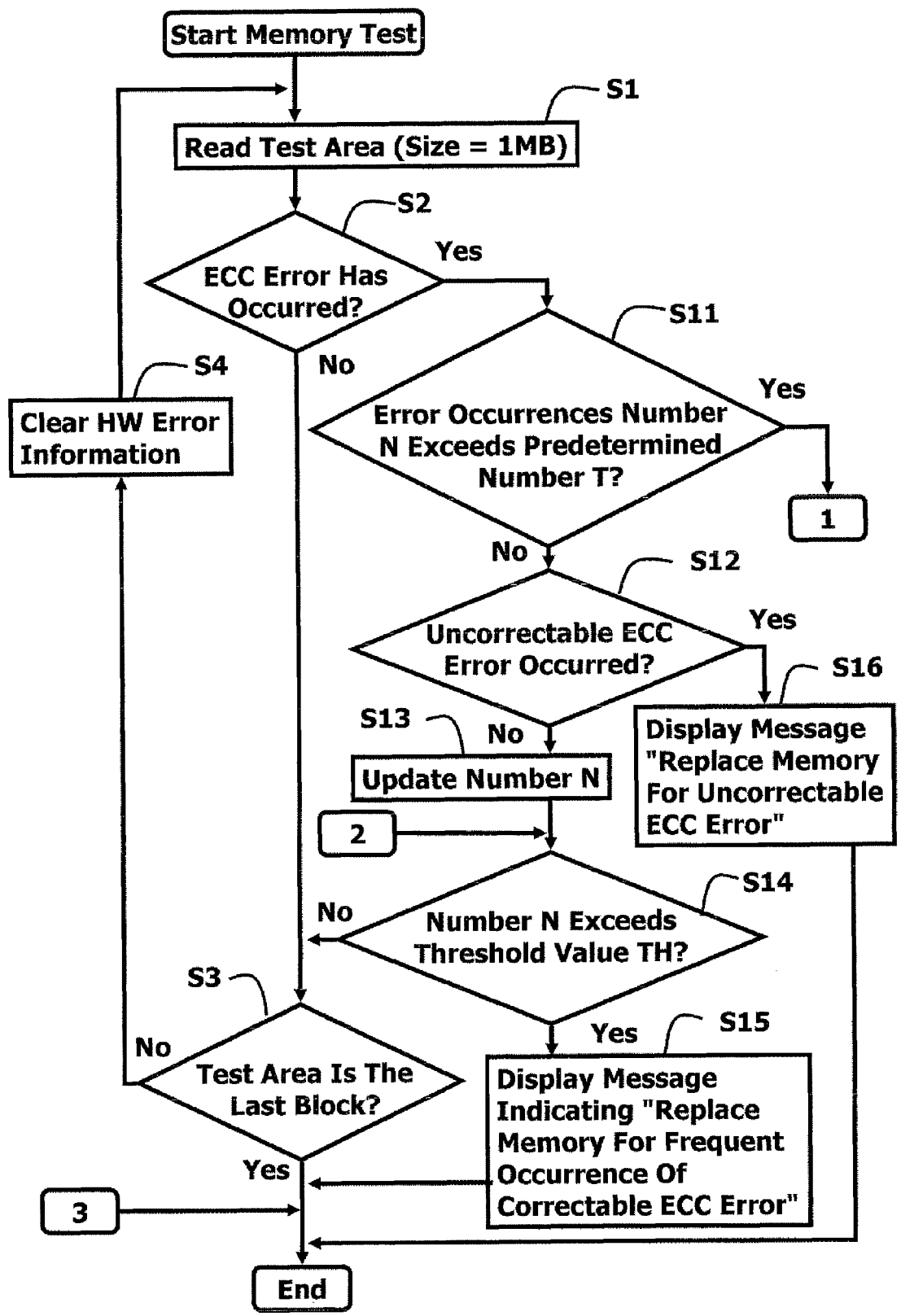
FIG. 2A and FIG. 2B are flowcharts illustrating processing executed by a processor in the defective-memory detecting apparatus illustrated in FIG. 1.
Figure 2B:
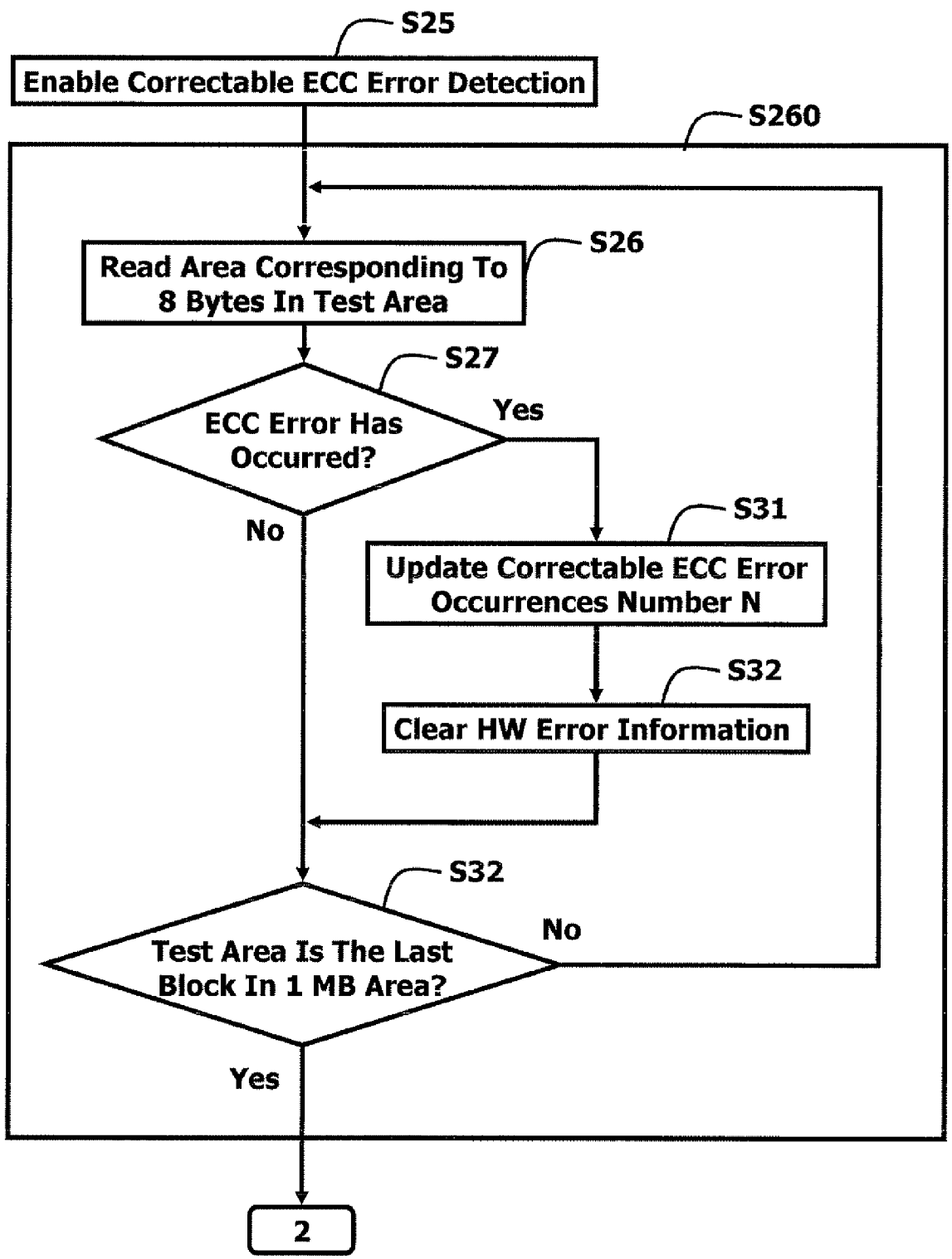

The processor 150 executes processing in accordance with flowcharts illustrated in FIG. 2A, FIGS. 2B and 2C. FIG. 2A and FIG. 2B are flowcharts illustrating processing executed by the processor 150 in the defective-memory detecting apparatus 1 illustrated in FIG. 1. FIG. 2C is a flowchart illustrating details of step S260 in the flowchart illustrated in FIG. 2B. In the flowcharts, numerals that follow "S" indicate step numbers.

Processing executed by the processor 150 will be described first. In step S11, the processor 150 determines whether or not the number of occurrences N of memory error exceeds a predetermined number of occurrences T (i.e., N>T) for each memory area to be tested (simply referred to as a "test area" hereinafter) of the divided memory areas in the entire memory area in the memory 12. Upon determining that the number of occurrences N of memory error exceeds the predetermined number of occurrences T (i.e., N>T), the processor 150 determines that it is possible to identify whether the memory error is a correctable type of error or an uncorrectable type of error, and the process proceeds to step S21.

In step S21, the processor 150 disables the counting of the number of occurrences N of memory error, the counting being performed by the counter 140 and being based on a correctable type of error In step S22, the processor 150 clears hardware error information (hereinafter "HW error information"), which is data stored in the register 130. In step S23, the processor 150 re-reads the test area for which it was determined in step S11 that the number of occurrences N of memory error exceeded the predetermined number of occurrences T (i.e., N>T).

In step S24, the processor 150 determines whether or not memory error has occurred in the test area read in step S23. When it is determined that no memory error has occurred in the test area, the processor 150 determines that the memory error is a correctable type of error and the process proceeds to step S25. In step S25, the processor 150 enables the counting performed by the counter 140. In step S26, the processor 150 causes the counter 140 to re-count the number of occurrences N of memory error for each of subdivided blocks in the test area.

In step S14, when the counted number of occurrences N of memory error is greater than or equal to a threshold TH (i.e., N≧TH), the processor 150 determines that the memory 12 is defective. The processor 150 sequentially executes steps S11, S21 to S26, and S14 described above to perform error determination for the all areas in the memory 12.

The above-described processing will now be described in more detail with reference to the flowcharts illustrated in FIGS. 2A and 2B. Overall processing executed by the processor 150 will be sequentially described from step S1. Before executing step S1, the processor 150 initially writes test pattern data from the CPU 11 to memory areas to be tested in the memory 12 via the memory controller 13.

The processing will be described in detail with reference to FIG. 2A and FIG. 2B. When the capacity of the memory 12 is, for example, 256 MB, in step S1, the processor 150 first reads a 0 to 1 MB test area of the entire 256 MB area in the memory 12. Then, each time the result of determination in step S3 is NO, the processor 150 sequentially reads one of a 1 to 2 MB test area, a 2 to 3 MB test area, a 3 to 4 MB test area, a 4 to 5 MB test area, . . . , and a 255 to 256 MB test area. More specifically, when the test area in a first test is the 0 to 1 MB test area, the processor 150 reads the 1 to 2 MB test area for a second test, each time the determination result in step S3 is NO. Similarly, the processor 150 sequentially reads one of the 2 to 3 MB test area for a third test, the 3 to 4 MB test area for a fourth test, the 4 to 5 MB test area for a fifth test, . . . , and the last 255 to 256 MB test area for a last test.

In step S2, the processor 15 determines whether or not ECC error has occurred in the test area read in step S1. When the determination result is NO, the process proceeds to step S3, and when the determination result is YES, the process proceeds to step S11. Data indicating whether or not the ECC error has occurred is stored in the register 130 in the memory controller 13.

FIGS. 3A and 3B illustrate data stored in the register 130 in the memory controller 13. More specifically, the data illustrated in FIG. 3A indicates occurrences of ECC error and the data illustrated in FIG. 3B indicates descriptions of the ECC error. As illustrated in FIG. 3A, the data stored in the register 130 indicates a first occurrence of ECC error and a second occurrence of ECC error. On the other hand, as illustrated in FIG. 3B, the descriptions of the ECC error contain an ECC error address, an error type, and so on. The ECC error can be classified into two types of error, that is, correctable ECC error and uncorrectable ECC error. The data stored in the register 30 corresponds to the aforementioned HW error information. The descriptions of the ECC error further contain, for example, data indicating which bit in the memory 12 is defective.

Referring back to the flowchart illustrated in FIG. 2A, when the determination result in step S2 is NO, i.e., when it is determined that no error has occurred, the processor 150 makes a determination in step S3 as to whether or not the test area is the last block, i.e., whether or not the test area is the last block in the 255 to 256 MB test area of all the 0 to 256 MB memory areas. When the determination result is YES in step S3, this routine ends. When the determination result is NO in step S3, the process proceeds to step S4 and the processor 150 sequentially executes steps S1 to S4 on the 1 to 2 MB test area, the 2 to 3 MB test area, the 3 to 4 MB test area, the 4 to 5 MB test area, . . . , and the 255 to 256 MB test area.

In step S4, the processor 150 clears the HW error information stored in the register 130 in the memory controller 13. After the execution of step S4, the process returns to step S1, in which the processor 150 reads the next test area.

Subsequently, upon determining that ECC error has occurred (i.e., YES) in step S2, the processor 150 performs the above-described primary processing in step S11. In step S11, the processor 150 determines whether or not the detected number of occurrences N of error exceeds the predetermined number of occurrences T When the determination result is NO, the process proceeds to step S12. When the determination result is YES, for example, when FCC error has occurred twice, the process proceeds to step S21. The number of occurrences of error can be counted since the memory controller 13 has a memory-error statistics function, and the number of occurrences N is stored in the counter 140.

In step S11, with respect to ECC error 0 (which is the first error) illustrated in FIG. 3A, the processor 150 determines that it is possible to determine whether the type of ECC error 0 is correctable or uncorrectable. This is because information regarding a correctable type of error or an uncorrectable type of error is contained in the data illustrated in FIG. 3B. However, with respect to ECC error 1 (which is the second error) illustrated in FIG. 3A, the processor 150 may not determine whether the type of ECC error 1 is correctable or uncorrectable. This is because information regarding a correctable type of error or an uncorrectable type of error is not contained in the data illustrated in FIG. 3B.

In step S12, the processor 150 identifies the type of ECC error, i.e., determines whether or not the type of ECC error is uncorrectable. When the type of error is correctable (i.e., NO), the process proceeds to step S13. When the determination result in step S12 is YES, the memory 12 is uncorrectable and the process proceeds to step S16. In step S13, the processor 150 updates the count value of the counter 140, i.e., updates the number of occurrences N of correctable ECC error to "1", and then the process proceeds to step S14.

In step S14, the processor 150 determines whether or not the number of occurrences N of correctable ECC error exceeds a predetermined number of occurrences, for example, "5". When the determination result in step S14 is YES, the processor 150 determines that the memory 12 is a defective memory due to the questionable quality of the memory 12 and the process proceeds to step S15. On the other hand, when the determination result in step S14 is NO, the process proceeds to step S3.

In step S15, the processor 150 displays a message indicating "Replace Memory for Frequent Occurrence of Correctable ECC Error" on a screen of the display 17, and ends the test for defective memory detection. A user of the defective-memory detecting apparatus 1 sees the displayed message to replace the memory 12.

On the other hand, when the determination result in step S12 is YES, in step S16, the processor 150 displays a message "Replace Memory for Uncorrectable ECC Error" on the screen of the display 17 and ends the test for defective memory detection. The user of the defective-memory detecting apparatus 1 sees the displayed message to immediately replace the memory 12 because it is uncorrectable.

When the determination in step S11 illustrates N>T, the processor 150 executes the primary processing steps S21 to S26 described above. In step S21, the processor 150 disables the detection of correctable ECC error, i.e., disables the counting of occurrences N of memory error, the counting being performed by the counter 140 and being based on a correctable type of error. This function for disabling the correctable-ECC-error detection is provided by the memory controller 13.

In step S22, the processor 150 clears the HW error information, which is data stored in the register 130. In step S23, the processor 150 reads the test area for which it was determined that the number of occurrences N of memory error exceeded the predetermined number of occurrences T (i.e., N>T), that is, re-reads the test area read in step S1.

In step S24, the processor 150 determines whether memory error has occurred in the test area read in step S23. Upon determining that no memory error has occurred in the test area (i.e., NO), the processor 150 determines that the memory error is a correctable type of error and the process proceeds to step S25. When the determination result in step S24 is YES, the process proceeds to step S41. In this case, it is to be noted that no ECC error occurs, since correctable ECC error is masked in this case so as to disable the detection of correctable ECC error.

In step S25, the processor 150 enables the detection of correctable ECC error, i.e., enables the counting performed by the counter 140, and the process proceeds to step S260. In step S260, the counter 140 counts the number of occurrences N of memory error for each subdivided block in the test area.

More specifically, in step S260, the counter 140 counts the number of occurrences N of correctable ECC error for each subdivided block in the test area and updates the number of occurrences N, which correspond to the count value of the counter 140. As illustrated in FIG. 2C, step S260 includes steps S26, S27, S28, S31, and S32. These steps will now be described with reference to FIG. 2C.

In step S26, the processor 150 reads an area corresponding to 8 bytes (64 bits) in the test area. For example, the processor 150 reads a 0 MB to 0 MB+8 byte area in the case of the 0 to 1 MB test area, reads a 1 MB to 1 MB+8 byte area in the case of the 1 to 2 MB test area, reads a 2 MB to 2 MB+8 byte area in the case of the 2 to 3 MB test area, reads a 3 MB to 3 MB+8 byte area in the case of the 3 to 4 MB test area, and reads a 4 MB to 4 MB+8 byte area in the case of the 4 to 5 MB test area. In step S27, the processor 150 determines whether or not ECC error has occurred. When the determination result is NO, the process proceeds to step S28. When the determination result is YES, the process proceeds to step S31. The HW error information indicating whether or not ECC error has occurred is stored in the register 130.

In step S31, the processor 150 updates the number of occurrences N of correctable ECC error and the process proceeds to step S32. In step S32, the processor 150 clears the HW error information stored in the register 130 and the process proceeds to step S28.

In step S28, the processor 150 determines whether or not the test area is the last block in the 1 MB area, i.e., the last n×8 byte block in the 1 MB area. When the determination result in step S28 is YES, the process proceeds to step S14. When the determination result in step S28 is NO, the process returns to step S26. As described above, steps S26, S27, and S28 or S26, S27, S31, S32, and S28 are repeated until the test area reaches the last n×8 byte block (in this example, "1 M byte−n×8 bytes to 1 M byte").

Referring back to FIG. 2B, when it is determined in step S24 that ECC error has occurred, in step S41, the processor 150 displays a message "Replace Memory for Uncorrectable ECC Error" on the screen of the display 17, because the detected error is uncorrectable ECC error. Thereafter, the processor 150 ends the test for defective memory detection.

FIG. 4 illustrates a specific example of memory areas to be tested by the processor 150 illustrated in FIG. 1. In this example, the entire memory area 500 is 1 GB, or 1024 MB, and stars indicate occurrences of correctable ECC error in a 0 to 1 MB memory area, a 1 to 2 MB memory area, a 2 to 3 MB memory area, a 3 to 4 MB memory area, a 4 to 5 MB memory area, . . . , and a 1023 to 1024 MB memory area. That is, in this example, first correctable ECC error has occurred in the 0 to 1 MB memory area, second and third correctable ECC errors have occurred in the 1 to 2 MB memory area, and fourth to eighth correctable ECC errors have occurred in the 3 to 4 MB memory area.

For ease of understating of the flowcharts, it is assumed in this case that the total size of the memory areas to be tested is 1024 MB (1 GB), the predetermined number of occurrences T is 1, and the threshold TH for memory replacement for frequent occurrence of correctable ECC error is 5. That is, a description will be given below in conjunction with a specific example in which it is determined that the memory 12 is defective when the number of occurrences N of correctable ECC error reaches the threshold TH, which is 5.

Before executing step S1, the processor 150 initially writes test pattern data to the memory areas to be tested in the memory 12 from the CPU 11 via the memory controller 13.

In step S1, the processor 150 first reads the 0 to 1 MB area of the test areas. In step S2, the processor 150 determines that ECC error has occurred in the 0 to 1 MB test area read in step S1, as illustrated in FIG. 4, and thus the process proceeds to step S11. Since the number of occurrences N of ECC error in the 0 to 1 MB test area is 1, as illustrated in FIG. 4, the processor 150 determines that the number of occurrences N does not exceed the predetermined number of occurrences T in step S11 and the process proceeds to step S12.

In step S12, the processor 150 determines whether or not the first error is uncorrectable. Data indicating whether the error is a correctable type of error or an uncorrectable type of error is stored in the register 130, as illustrated in FIG. 3B. Since the number of occurrences N of error in this example is 1, the processor 150 determines that the first error is correctable ECC error (i.e., NO in step S12) and the process proceeds to step S13.

Since the current count value of the counter 140 is 0, the processor 150 adds 1 to the current value "0" in step S13. Since the number of occurrences N of correctable ECC error is 1 at this point and thus does not exceed the threshold TH (=5) in step S14, the process proceeds to step S3.

In step S3, the processor 150 determines whether or not the current test area (i.e., the 0 to 1 MB test area) is the last block in the 1023 to 1024 MB test area. Since the determination result is NO, the process proceeds to step S4. In step S4, the processor 150 clears the HW error information and the process returns to step S1, in which the processor 150 reads the next 1 to 2 MB test area.

Since correctable ECC error has occurred in the 1 to 2 MB test area twice, as illustrated in FIG. 4, the determination result in step S2 is YES. Since the number of occurrences of ECC error in the 1 to 2 MB test area is 2 and thus exceeds the predetermined number of occurrences T, the determination result in step S11 is YES and the process proceeds to step S21.

In step S21, the processor 150 disables the counting of occurrences of correctable ECC error and executes steps S22, S23, and S24. Since the counting of occurrences of correctable ECC error has been disabled in step S21, the processor 150 determines that no ECC error occurs in step S24, and the process proceeds to step S25.

The processor 150 enables the counting of occurrences of correctable ECC error in step S25, and executes step S26. Thereafter, in step S27, the processor 150 determines that correctable ECC error has occurred (i.e., YES), and the process proceeds to step S31, in which the processor 150 increases the number of occurrences N to 3 by adding 2 to the current value "1".

Subsequently, the processor 150 executes steps S32 and S28. Until the current test area reaches the last n×64-bit block in the 1 to 2 MB test area, the processor 150 executes step S26, S27, S31, S32, and S28 described above. When the determination result in step S28 is YES, the process proceeds to step S14.

Since the number of occurrences N of correctable ECC error at this point is 3 and thus does not exceed the threshold TH (=5) in step S14, the process proceeds to step S3.

In step S3, the processor 150 determines whether or not the current test area (i.e., the 1 to 2 MB test area) is the last block in the 1023 to 1024 MB test area. Since the determination result is NO, the process proceeds to step S4, in which the processor 150 clears the HW error information. The process then returns to step S1, in which the processor 150 reads the next 2 to 3 MB test area.

Since neither correctable ECC error nor uncorrectable ECC error has occurred in the 2 to 3 MB test area, as illustrated in FIG. 4, the determination result in step S2 is NO and thus the process proceeds to step S3. In step S3, the processor 150 similarly determines whether or not the current test area (i.e., the 2 to 3 MB test area) is the last block in the 1023 to 1024 MB test area. Since the determination result is NO, the process proceeds to step S4, in which the processor 150 clears the error information HW, and the process returns to step S1, in which the processor 150 reads the next 3 to 4 MB test area.

Since correctable ECC error has occurred in the 3 to 4 MB test area five times, as illustrated in FIG. 4, the determination result in step S2 is YES, as in the case of the 1 to 2 MB test area. Since the number of occurrences N of ECC error in the 3 to 4 MB test area is 5 and thus exceeds the predetermined number of occurrences T, the determination result in step S11 is YES and the process proceeds to step S21. Subsequently, the processor 150 executes step S22 to S28, as in the case of the 1 to 2 MB test area, and the process proceeds to step S14.

Since the number of occurrences N of correctable ECC error at this point is 8 and thus exceeds the threshold TH (=5) in step S14, the process proceeds to step S15.

Since it was determined in step S14 that the number of occurrences N of correctable ECC error exceeded the threshold TH, the processor 150 displays a message "Replace Memory for Frequent Occurrence of Correctable ECC Error" on the screen of the display 17 in step S15, and ends the test for defective-memory detection without testing the memory areas subsequent to the 4 to 5 MB test area.

The above-described defective-memory detecting apparatus according to the present embodiment can achieve the followings. Firstly, it is possible to perform memory ECC test at high speed. In general, it takes time to access the HW error information. According to the present embodiment, however, when ECC error does not occur for every 1 MB test area, the defective-memory detecting apparatus can detect a defective memory at high speed, since it accesses the HW error information only for each 1 MB test area. The size of the test area can be arbitrary changed.

Secondly, even when error has occurred N+1 times or more sequentially, the defective-memory detecting apparatus can determine the type of error (i.e., a correctable type of error or an uncorrectable type of error). Thirdly, it is possible to correctly count the number of occurrences of correctable ECC error.

The memory ECC test is typically performed during initialization of hardware. In this case, performing memory ECC test in a background process during execution of processing (such as LAN initialization) that involves a long waiting time allows for a reduction in the processing time. The expression "background process" as used herein refers to a process that is not intended by a user of a computer having a multi-task OS (operating system) for executing multiple processes in parallel.

The above-described defective-memory detecting apparatus may store register information indicating the memory error. And the above-described defective-memory detecting apparatus may not use area of the memory corresponding to the stored register information.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiment of the present inventions have been described in detail, it should be understood that the various changes, substitutions, and alterations could be made hereto without departing from the spirit and scope of the invention.

What is claimed is:

1. A method of controlling an apparatus including a memory having a plurality of memory areas, the method comprising:

reading data stored in a one of the memory areas to be tested;

counting a number of occurrences of memory error detected on the basis of data written into each of the memory areas;

when the number of occurrences of memory error of the read memory area exceeds a first predetermined number of occurrences, disabling the counting of the number of occurrences of memory error of a correctable type;

determining whether the memory error of the read memory area has occurred;

enabling the counting performed by a counter to re-count the number of occurrences of memory error of the read memory area, upon determining that no memory error has occurred, and determining that the memory is defective when the number of occurrences of memory error is greater than or equal to a second predetermined number.

2. The method according to claim 1, further comprising correcting the memory error of the correctable type by using an error correction mechanism.

3. The method according to claim 1, further comprising detecting an uncorrectable memory error for the read memory area in connection with the disabling.

4. The method according to claim 1, wherein the counting is performed at the initiation of the apparatus.

5. An apparatus comprising:

a memory having a plurality of memory areas;

a counter to count a number of occurrences of memory error detected on the basis of data written into the each of the memory areas; and a processor executing:

reading data stored in a one of the memory areas to be tested, when a number of occurrences of memory error of the read memory area exceeds a first predetermined number of occurrences, disabling the counting of the number of occurrences of memory error of a correctable type performed by the counter, determining whether or not the memory error of the read memory area has occurred, enabling the counting performed by the counter to re-count the number of occurrences of memory error of the read memory area, upon determining that no memory error has occurred, and determining that the memory is defective when the number of occurrences of memory error is greater than or equal to a second predetermined number.

* * * * *

UNITED STATES PATENT AND TRADEMARK OFFICE
CERTIFICATE OF CORRECTION

PATENT NO.        : 7,971,112 B2
APPLICATION NO.   : 12/358366
DATED             : June 28, 2011
INVENTOR(S)       : Takehiko Murata It is certified that error appears in the above-identified patent and that said Letters Patent is hereby corrected as shown below:

Column 10, Line 40, in Claim 5, after "whether" delete "or not".

Signed and Sealed this
Thirteenth Day of September, 2011

David J. Kappos
*Director of the United States Patent and Trademark Office*